(12) United States Patent
Schaepkens et al.

(10) Patent No.: US 7,282,244 B2
(45) Date of Patent: Oct. 16, 2007

(54) REPLACEABLE PLATE EXPANDED THERMAL PLASMA APPARATUS AND METHOD

(75) Inventors: Mark Schaepkens, Ballston Lake, NY (US); Charles Dominic Iacovangelo, Clifton Park, NY (US); Thomas Miebach, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 502 days.

(21) Appl. No.: 10/655,350

(22) Filed: Sep. 5, 2003

(65) Prior Publication Data

US 2005/0051094 A1    Mar. 10, 2005

(51) Int. Cl.
*H05H 1/24* (2006.01)
(52) U.S. Cl. .................................... 427/569
(58) Field of Classification Search ............... 427/569
See application file for complete search history.

(56) References Cited

U.S. PATENT DOCUMENTS

| | | | |
|---|---|---|---|
| 4,871,580 A | | 10/1989 | Schram et al. |
| 5,733,662 A | * | 3/1998 | Bogachek .................. 427/446 |
| 5,846,330 A | * | 12/1998 | Quirk et al. .......... 118/723 DC |
| 6,110,544 A | | 8/2000 | Yang et al. |
| 6,213,049 B1 | | 4/2001 | Yang |
| 6,365,016 B1 | | 4/2002 | Iacovangelo et al. |
| 6,397,776 B1 | | 6/2002 | Yang et al. |
| 6,426,125 B1 | * | 7/2002 | Yang et al. .................. 427/488 |
| 2001/0022295 A1 | | 9/2001 | Hwang |
| 2002/0050323 A1 | | 5/2002 | Moisan et al. |
| 2003/0049468 A1 | | 3/2003 | Hu et al. |
| 2003/0072881 A1 | | 4/2003 | Yang et al. |
| 2003/0075273 A1 | | 4/2003 | Kilpela et al. |
| 2004/0040833 A1 | | 3/2004 | Schaepkens et al. |
| 2004/0188019 A1 | * | 9/2004 | Cardozo et al. ........ 156/345.43 |

FOREIGN PATENT DOCUMENTS

EP        0 887 110        12/1998

OTHER PUBLICATIONS

PCT International Search Report dated Mar. 14, 2005.
van de Sanden et al., The expanding thermal arc plasma: the low-flow regime, Plasma Sources Sci. Technol., 7, pp. 28-35 (1998).

* cited by examiner

Primary Examiner—Timothy Meeks
Assistant Examiner—Kelly M. Stouffer
(74) Attorney, Agent, or Firm—Andrew J. Caruso; William E. Powell, III

(57) ABSTRACT

The present invention provides a deposition process for plasma enhanced chemical vapor deposition of a coating on a substrate. The process comprises determining a target process condition within a chamber of an expanding thermal plasma generator; the generator comprising a cathode, a replaceable cascade plate and an anode comprising a concentric orifice; and thereafter replacing the cascade plate with another plate having a configured orifice to effect the identified target process condition. The plasma is then generated at the target process condition by providing a plasma gas to the plasma generator and ionizing the plasma gas in an arc between cathode and anode within the generator and expanding the gas as a plasma onto a substrate in a deposition chamber.

17 Claims, 5 Drawing Sheets

Standard

Double

Straight

Standard

Double

Straight

Standard

Double

Straight

REPLACEABLE PLATE EXPANDED THERMAL PLASMA APPARATUS AND METHOD

BACKGROUND OF THE INVENTION

This invention relates to plasma enhanced chemical vapor deposition. More particularly, it relates to deposition in an expanding thermal plasma (hereinafter referred to as "ETP") apparatus to coat substrates.

Yang et al. U.S. Pat. No. 6,110,544 discloses an ETP method and apparatus for depositing an adherent coating onto a surface of a substrate by plasma deposition. The process comprises passing a plasma gas through a direct current arc plasma generator to form a plasma. A substrate is positioned in an adjoining vacuum chamber. A reactant gas and an oxidant are injected into the plasma. The plasma is expanded into a diverging nozzle-injector extending from the plasma generator into the vacuum chamber towards the substrate. A reactive species formed by the plasma from the oxidant and reactant gas contact the surface of the substrate for a period of time sufficient to form an adherent coating.

Coatings that can be deposited by ETP include silicon oxide-based hardcoats that protect a plastic substrate from abrasion. Also, ETP can be used to deposit metal oxide-based coatings such as zinc oxide. High coating deposition rates can be achieved by ETP at relatively low temperatures. Hence, ETP is particularly valuable to coat lower Tg materials such as a polycarbonate (hereinafter "PC") sheet or film. However, while current ETP apparatus and processes are valuable, it is always desirable to provide an improved deposition apparatus and method that can be controlled to produce a desired product or that can be operated at lower cost.

BRIEF DESCRIPTION OF THE INVENTION

The invention provides an improved apparatus and method for depositing a layer on a substrate that comprises determining a target process condition within a chamber of an expanding thermal plasma generator for plasma enhanced chemical vapor deposition of a coating on a substrate; the generator comprising a cathode, replaceable cascade plate and anode with concentric orifice; and replacing the cascade plate with another plate having a configured orifice to effect the identified target process condition; and generating a plasma at the target process condition by providing a plasma gas to the plasma generator and ionizing the plasma gas in an arc between cathode and anode within the generator and expanding the gas as a plasma onto a substrate in a deposition chamber.

In an aspect, the invention is a deposition apparatus for generating a controllable plasma; comprising a deposition chamber; adapted to be maintained at subatmospheric pressure; an article support within the deposition chamber; an expanding thermal plasma generator comprising a cathode, a single cascade plate and an anode and a communicating orifice through the cascade plate, the orifice having a length of 1 mm to less than 20 mm.

In another aspect, a method of depositing a layer on a substrate, comprises determining a target property in a plasma gas generator for plasma enhanced chemical vapor deposition of a coating on the substrate; the generator comprising a cathode, replaceable cascade plate and anode with concentric orifice; and replacing the cascade plate with another plate having a configured orifice to effect the target property.

In another aspect, a method of depositing a layer on an article comprises flowing a plasma gas in a plasma generation chamber in communication with a deposition chamber, the plasma generation chamber comprising a cathode and an anode and intervening cascade plate having a first orifice configuration, the article being disposed in the deposition chamber; generating an arc in the plasma generation chamber to create a plasma, which flows into the deposition chamber; injecting a material into the plasma and reacting the material to deposit a layer on the article; determining a desired layer characteristic for the article; and replacing the cascade plate having a first orifice configuration with another plate having a different orifice configuration that provides the desired layer thickness.

In still another aspect, a method for generating a substantially controllable plasma, the method comprises providing one plasma source comprising: a plasma chamber; an anode and a cathode disposed in the plasma chamber and a single cascade plate replaceably interposed between the anode and cathode; a power source coupled to the cathode; and a plasma gas inlet; providing a plasma gas through the plasma gas inlet to the plasma chamber; generating a plasma in the plasma chamber; controlling the plasma by replacing the cascade plate with another having an orifice geometry to obtain a desired plasma process condition.

The invention also relates to the article produced by the inventive method.

DETAILED DESCRIPTION OF THE INVENTION

Figure 1:
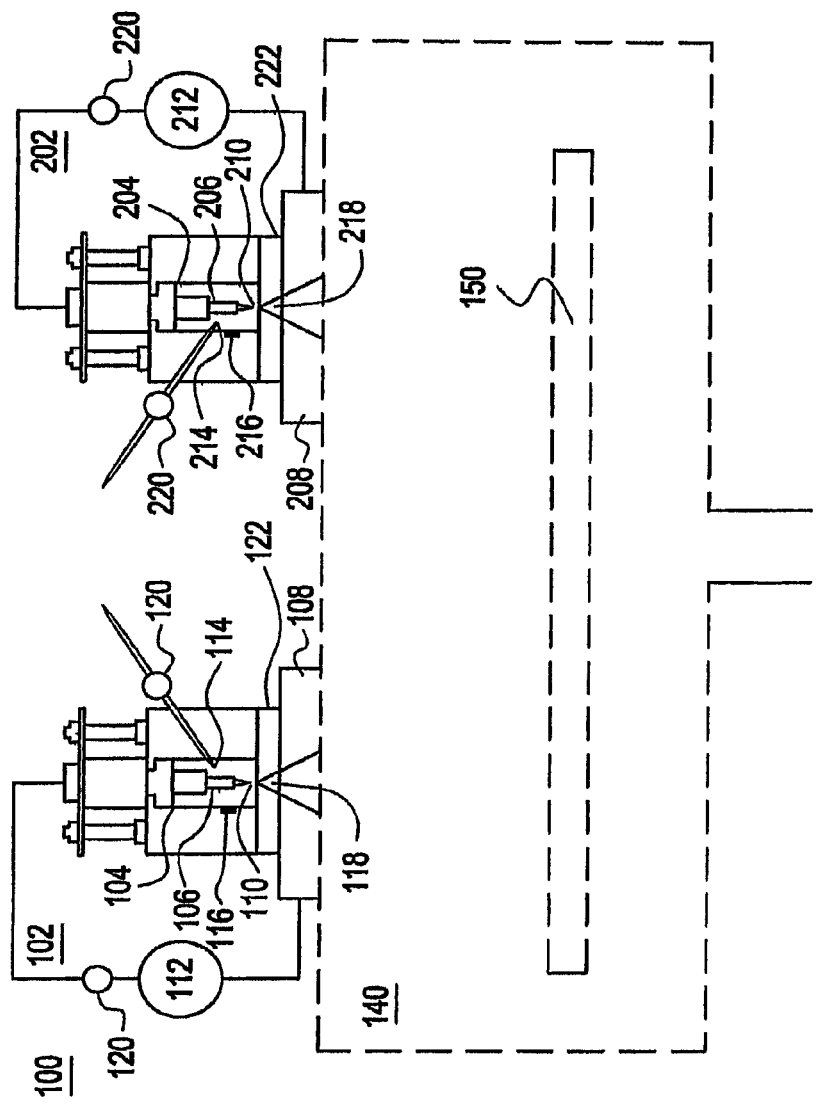
FIG. 1 is a schematic representation of an apparatus for generating a plasma.

This invention relates to plasma enhanced chemical vapor deposition. In an embodiment, the invention relates to deposition in an ETP system to coat or treat a substrate.

Plastics and other polymers are commercially available materials possessing physical and chemical properties that are useful in a wide variety of applications. For example, polycarbonates are a class of polymers which, because of their excellent breakage resistance, have replaced glass in many products, such as automobile head-lamps, safety shields, eyewear, and windows. However, many polycarbonates also have properties which may be disadvantageous in some applications, such as low abrasion resistance and susceptibility to degradation from exposure to ultraviolet (UV) light. Thus, untreated polycarbonates are not commonly used in applications such as automotive and other windows which are exposed to ultraviolet light and physical contact from a variety of sources.

Layers of abrasion resistant material and UV absorbing material can be applied to polycarbonate substrates to provide materials suitable for these applications. Various deposition techniques have been used for applying these coatings. For example, chemical vapor deposition (CVD) produces a solid film on a substrate surface by thermal activation and surface reaction of gaseous reagents that contain the desired constituents of the film. Energy required to pyrolyze the reactants is supplied by heating the substrate. In order to achieve reasonable reaction rates, the substrate is heated to a relatively high temperature, in the range of about 500 to 2000° F. These temperatures preclude application of the CVD process to heat sensitive substrate materials such as polycarbonate ("PC"). Other methods include plasma enhanced chemical vapor deposition (PECVD), physical vapor deposition (PVD) and wire arc deposition.

Deposition apparatus generally include a plasma source comprising a plasma chamber, an anode and a cathode disposed in the plasma chamber and a plurality of cascade plates interposed between the anode and cathode; a power source coupled to the cathode; and a plasma gas inlet. It has been found that the orifice of a single cascade plate can be configured to affect processing conditions such as arc-pressure, cathode voltage, plasma resistivity and deposition rate. Hence in an embodiment, the invention relates to an apparatus including a single cascade plate that is replaceable for the purpose of effecting a desired plasma property.

In this specification, "replaceable" means that the plate can be removed and replaced with another plate without substantial permanent supporting structural alteration. For example, the plate is "replaceable" if it can be removed and replaced by loosening nuts and withdrawing rods through the plate in accordance with the configuration shown in FIG. 2. The term "replaceable" as used in this specification distinguishes cascade plates that are permanently installed as a fixed part of the chamber supporting structure, or the like.

Features of the invention will become apparent from the drawings and following detailed discussion, which by way of example without limitation describe preferred embodiments of the invention.

FIG. 1 is a schematic representation of an apparatus 100 for generating a plasma for producing a substantially controllable plasma of the invention. The apparatus 100 comprises a first plasma generator 102, a second plasma generator 202 and a chamber 140. The invention is not limited to the embodiment represented in the FIG. 1; apparatus 100, but may comprise a single plasma generator or more than two plasma generators as well. It is understood that, while various features of first plasma generator 102 are described in detail and are referred to throughout the following description, the following description is applicable to second plasma generator 202 as well.

First plasma generator 102 comprises a plasma chamber 104, a cathode 106, and an anode 108 and a replaceable cascade plate 122 in between. Cathode 106 is disposed within, and extends into plasma chamber 104. While a single cathode 106 is shown in FIG. 1, it is understood that plasma generator 102 may include multiple cathodes 106. Anode 108 is located at one end of plasma chamber 102. An exit port 118 provides fluid communication between plasma chamber 104 and second chamber 140. The plasma generated within plasma chamber 104 exits plasma chamber 104 through exit port 118 and enters second chamber 140. In one embodiment, exit port 118 may comprise an orifice formed in anode 108. In another embodiment, exit port may comprise at least one "floating" (i.e., electrically insulated from both cathode 106 and anode 108) cascade plate 122 separating anode 108 from the rest of plasma chamber 102. Alternatively, exit port 118 may be located in a floating wall in one of plasma chamber 102 and second chamber 140.

A gas for generating the plasma (hereinafter referred to as a "plasma gas") is injected into plasma chamber 104 through at least one plasma gas inlet 114, metered by meter 120, the plasma gas may comprise at least one inert or non-reactive gas, such as, but not limited to, a noble gas (i.e., He, Ne, Ar, Xe, Kr). Alternatively, in embodiments where the plasma is used to etch the surface, the plasma gas may comprise a reactive gas, such as, but not limited to, hydrogen, nitrogen, oxygen, fluorine, or chlorine. Flow of the plasma gas may be controlled by a flow controller, such as a mass flow controller, located between a plasma gas generator (not shown) and the at least one plasma gas inlet 114. A first plasma is generated within plasma chamber 104 by injecting the plasma gas into plasma chamber 104 through the at least one plasma gas inlet 114 and striking an arc between cathode 106 and anode 108. The voltage needed to strike an arc between cathode 106 and anode 108 is provided by power source 112. In one embodiment, power source 112 is an adjustable DC power source that provides up to about 100 amps of current at a voltage of up to about 50 volts. Second chamber 140 is maintained at a second chamber pressure, which is substantially less than a first plasma chamber pressure. In one embodiment, second chamber 140 is maintained at a pressure of less than about 1 torr (about 133 Pa) and, preferably, at a pressure of less than about 100 millitorr (about 0.133 Pa), while plasma chamber 104 is maintained at a pressure of at least about 0.1 atmosphere (about $1.01 \times 10^4$ Pa). As a result of the difference between the first plasma chamber pressure and the second chamber pressure, the first plasma passes through exit port 118 and expands into second chamber 140.

Second chamber 140 is adapted to contain an article 150 that is to be treated with the plasmas produced by apparatus 100. In one embodiment, such plasma treatment of article 150 comprises injecting at least one reactive gas into the plasma produced by apparatus 100 and depositing at least one coating on a surface of article 150. The surface of article 150 upon which the at least one plasma impinges may be either planar or non-planar. The characteristics of the plasma generated by plasma generator 102 vary according to the configuration of replaceable cascade plates 122, and 222 as hereinafter described. Apparatus 100 is capable of providing other plasma treatments in which at least one plasma impinges upon a surface of article 150, such as, but not limited to, plasma etching at least one surface of article 150, heating article 150, lighting or illuminating article 150, or functionalizing (i.e., producing reactive chemical species) on a surface of article 150. The characteristics of the plasma treatment process are strongly affected by the operating parameters of the plasma generator. Among such operating parameters are the operating pressure within the plasma generator, plasma resistance, the potential across the cathode and anode, the plasma current and the cathode-to-anode distance.

In one embodiment, the plasmas generated by at least one of first plasma generator 102 and second plasma generator 202 are expanding thermal plasmas. In an ETP, a plasma is generated by ionizing the plasma source gas in the arc generated between at least one cathode 106 and anode 108 to produce a positive ion and an electron. For example, when an argon plasma is generated, argon is ionized, forming argon ions ($Ar^+$) and electrons ($e^-$). The plasma is then expanded into a high volume at low pressure, thereby cooling the electrons and positive ions. In the present invention, the plasma is generated in plasma chamber 104 and expanded into second chamber 140 through exit port 118. As previously described, second chamber 140 is maintained at a substantially lower pressure than the plasma chamber 104. In an ETP, the positive ion and electron temperatures are approximately equal and in the range of about 0.1 eV (about 1000 K). In other types of plasmas, the electrons have a sufficiently high temperature to substantially affect the chemistry of the plasma. In such plasmas, the positive ions typically have a temperature of about 0.1 eV and the electrons have a temperature of about 1 eV, or 10,000 K, or higher. Consequently, the electrons in the ETP are too cold and thus have insufficient energy to cause direct dissociation of any gases that may be introduced into the ETP. Such gases may instead undergo charge exchange and dissociative recombination reactions with the electrons within the ETP.

Commonly assigned Johnson et al., application Ser. No. 10/064,888 filed Aug. 27, 2002 discloses a plasma generator 102 that includes at least one adjustable cathode 106. The disclosure of this application is herein incorporated by reference in its entirety. According to Johnson et al., gap 110 may be set to a predetermined distance by moving cathode 106. In Johnson et al., changes in plasma chamber pressure or cathode voltage, as detected and monitored by sensor 116, are indicative of changes in gap 110. Cathode drift may, for example, be indicated by shifts or changes in cathode voltage and plasma chamber pressure. Plasma chamber pressure data obtained during statistical process control as feedback, for example, may be used to control gap 110. Compensation of cathode drift may be achieved during operation of plasma generator 102 by movement of adjustable cathode 106 in response to input by the at least one sensor 116 to maintain gap 110 at the selected distance. Variation due to cathode drift of the plasma 104 generated by plasma generator 102 is thus eliminated or significantly reduced by such adjustment of cathode 106. Such movement of the adjustable cathode 106 may be performed in real time either manually or by a controller. As conditions dictate, gap 110 is increased or decreased by either applying or releasing pressure to the pressure plate, or gap 110 may be maintained at a constant value as adjustable cathode 106 erodes during operation of plasma generator 102 by applying pressure plate as needed. In another embodiment, pressure means may comprise a pneumatic drive coupled to adjustable cathode 106. The pneumatic drive may increase, decrease, or maintain gap 110 at a selected value—as conditions dictate—by moving adjustable cathode 106 accordingly.

Reagents are supplied to the plasma through supply lines 114, 214, but it will be understood that more or fewer supply lines and associated structure elements may be present, depending on the chemistry of the desired plasma. For example, oxygen gas may be supplied through one line, zinc may be supplied through another, and indium may be supplied through still another to form an indium zinc oxide film on substrate 150. Oxygen and zinc only can be supplied if a zinc oxide film is to be deposited. Illustrative depositing reagents include oxygen, nitrous oxide, nitrogen, ammonia, eaton dioxide, fluorine, sulfur, hydrogen sulfide, silane, organosilanes, organosiloxanes, organosilazanes and hydrocarbons for making oxide, nitride, fluoride, carbide, sulfide and polymeric coatings. Examples of other metals whose oxides, fluorides, and nitrides may be deposited in the same way are aluminum, tin, titanium, tantalum, niobium and cerium. Alternatively, oxygen and hexamethyldisiloxane, tetramehyidisiloxane or octamethylclotetrasiloxane may be supplied to form a silica-based hardcoat. Other types of coatings which can be deposited by ETP can be used.

The treated or coated substrate 150 may be of any suitable material including metal, semiconductor, ceramic, glass or plastic. In a preferred embodiment, it is a thermoplastic such as polycarbonate, copolyestercarbonate, polyethersulfone, polyntherimide or acrylic. Polycarbonate is particularly preferred; the term "polycarbonate" in this context including homapolycarbonates, copolycarbonates and copolyestercarbonates.

It is contemplated within this invention to provide for motion of the plasma plumes impinging on the substrate. This may be achieved by mounting the ETP generator or the nozzles associated therewith on swivels that may be manually or computer controlled. It may also be achieved by mounting one or more magnets on or near the walls of the deposition chamber, thereby permitting magnetic variation of the direction and shape of the plasma plume.

In those embodiments in which apparatus 100 includes more than one plasma generator, second plasma generator 202 includes features corresponding to those of first plasma generator 102, which are described herein. For example, plasma generator 202 includes cathode 206, anode 208, gap 210, at least one plasma gas inlet 214, at least one sensor 216, exit port 218, and replaceable cascade plate 222.

Figure 2:
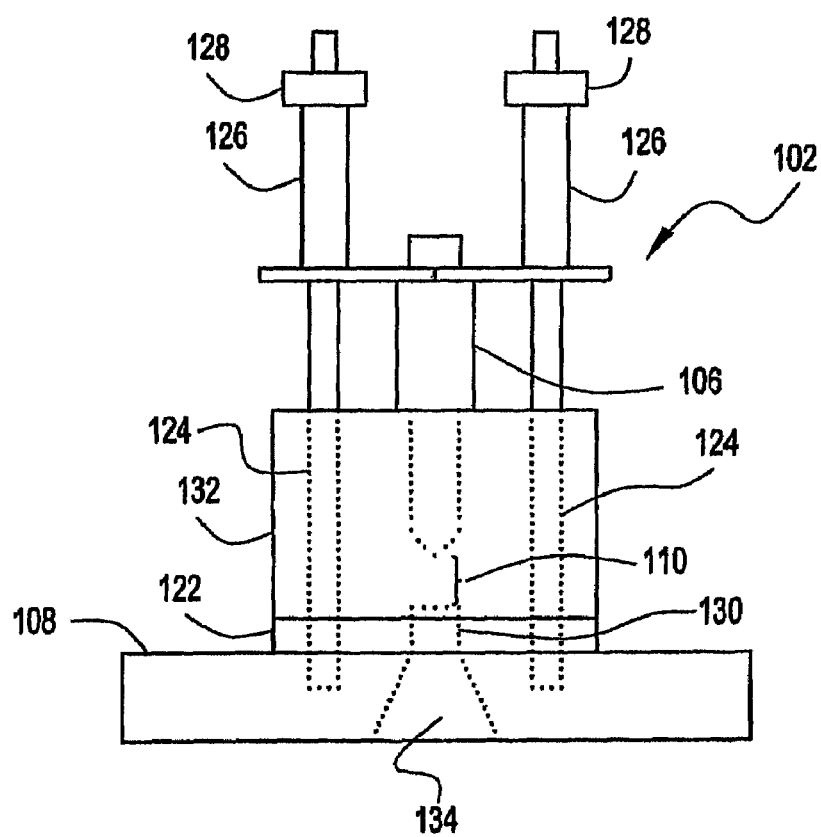
FIG. 2 is a schematic cross-sectional view of an ETP generator useful in the invention.

The invention provides a plasma generator 102, 202 having a replaceable cascade plate 122, 222 that can be customized to provide a desired plasma plume property. FIG. 2 is a schematic cross-sectional view of generator 102 or 202 showing the replaceable cascade plate 122, 222. In FIG. 2, generator 102 is shown including cathode 106, anode 108 and replaceable cascade plate 122. Cathode 106, anode 108 and cascade plate 122 are secured together by threaded rods 124 that provide a securing functionality that can be either adjusted to change gap 110 in accordance with Johnson et al. or that can be disassembled to remove cascade plate 122 for replacement with a cascade plate of a different configuration to provide a plasma plume of different characteristics or properties as hereinafter described. The threaded rods are part of an assembly that includes fiber glass sleeve 126 and adjustment nut 128 that can be adjusted to change gap 110 or removed for disassembly of cascade plate 122. In FIG. 2, the cascade plate is removed by unscrewing adjustment nuts 128 and threaded rods 124 and removing cathode housing 132. The cascade plate 122 is then removed and replaced with a cascade plate with a different orifice configuration that provides different plasma plume characteristics as desired.

The characteristics of the plasma generated by first plasma generator 102 depend upon the pressure of the plasma gas within plasma chamber 104 and the voltage (or potential) of cathode 106. Thus, characteristics of the plasma may be controlled by adjusting at least one of the pressure of the plasma gas within plasma chamber 104 and the voltage of cathode 106. Plasma gas pressure may be monitored by the at least one sensor 116 and adjusted accordingly. One means of adjusting the plasma gas pressure is by controlling the flow of plasma gas into plasma chamber 104 through plasma gas inlet 114. Means for controlling the flow of plasma gas into plasma chamber 104 include, but are not limited to, needle valves and mass flow controllers. The cathode voltage (or potential) may be similarly monitored by the at least one sensor 116, and adjusted by adjusting power supply 112 accordingly. It is understood that, in those embodiments having a second plasma generator 202, the characteristics of the plasma generated by second plasma generator 202 may be similarly controlled by adjusting at least one of the plasma gas pressure within plasma chamber 204 and the voltage of cathode 206 in response to input provided by the at least one sensor 216.

According to an embodiment of the invention, pressure of the plasma gas and voltage (or potential) are adjusted and controlled by varying gap 110, 210 in accordance with Johnson et al. Accordingly, at least one of the pressure of the plasma gas within plasma chamber 104 and the cathode voltage of cathode 106 can be adjustable with respect to the plasma gas pressure within plasma chamber 204 and the cathode voltage of cathode 206, respectively. Thus, conditions within plasma chamber 104—and thus the first plasma produced by first plasma generator 102—are adjustable with respect to conditions within plasma chamber 204 and the second plasma produced by second plasma generator 202, and vice versa. For example, the first plasma generated by first plasma source may be either "tuned" to eliminate or minimize variation between the first plasma and the second plasma or "detuned" to be dissimilar with respect to each other.

Figure 3A:
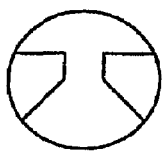
FIG. 3A, FIG. 3B and FIG. 3C are schematic representations of cascade plate configurations.
Figure 3B:
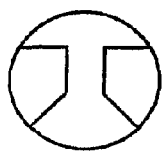
Figure 3C:
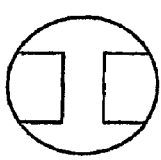

In FIG. 2, cascade plate 122 is characterized by cylindrical orifice 130 with straight walls that cooperate with flared orifice 134 of the anode 108 to provide an expanding plasma plume within chamber 140. In accordance with the invention, plasma plume properties are controlled by varying the configuration of cylindrical orifice 130. FIG. 3A, FIG. 3B and FIG. 3C are schematic representations of cascade plate orifice configurations that can be used to change plasma plume properties such as Ar pressure (Torr) or voltage (v). FIG. 3A shows a partially straight walled orifice terminating in a flared configuration approaching the anode. FIG. 3B shows an elongated channel terminating in a flare configuration and FIG. 3C shows a straight wall channel configuration without flare. The length of the single cascade orifice to provide control of the plasma plume properties can be between 1 mm to less than 20 mm. Desirably, the single cascade orifice has a length between 1.5 mm to 10 mm and preferably between 2 mm to 8 mm.

Figure 4A:
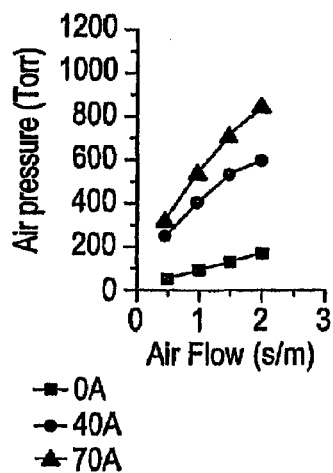
FIG. 4A, FIG. 4B and FIG. 4C show pressure relationships for the FIG. 3A, FIG. 3B and FIG. 3C cascade plate configurations.
Figure 4B:
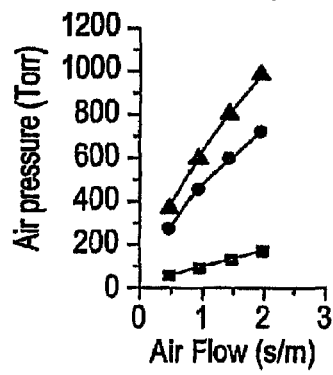
Figure 4C:
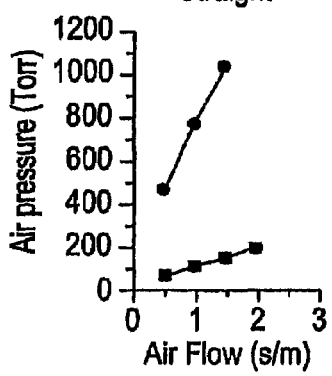
Figure 5A:
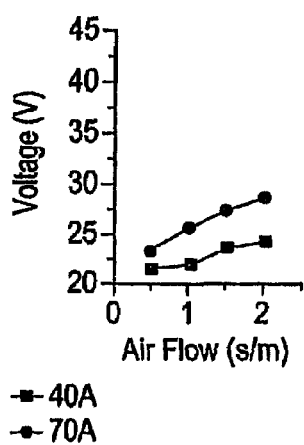
FIG. 5A, FIG. 5B and FIG. 5C show voltage relationships for the FIG. 3A, FIG. 3B and FIG. 3C cascade plate configurations.
Figure 5B:
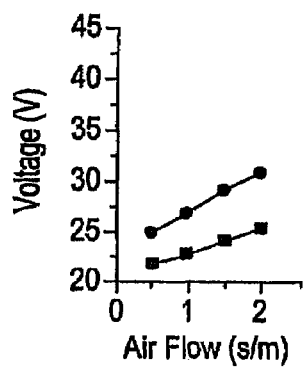
Figure 5C:
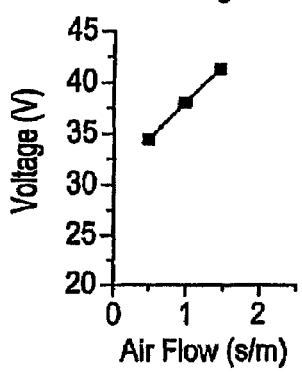

FIG. 4A, FIG. 4B and FIG. 4C show pressure relationships for the FIG. 3A, FIG. 3B and FIG. 3C cascade plate configurations at a flow rate of 0.5 to 2 liters per minute (Lpm) and FIG. 5A, FIG. 5B and FIG. 5C show voltage relationships for the FIG. 3A, FIG. 3B and FIG. 3C cascade plate configurations. The data illustrated in FIG. 4A, FIG. 4B and FIG. 4C and FIG. 5A, FIG. 5B and FIG. 5C show that a given process condition such as current or argon flow, arc-pressure and cathode voltage increases as length of the orifice cylindrical wall increases.

Figure 6A:
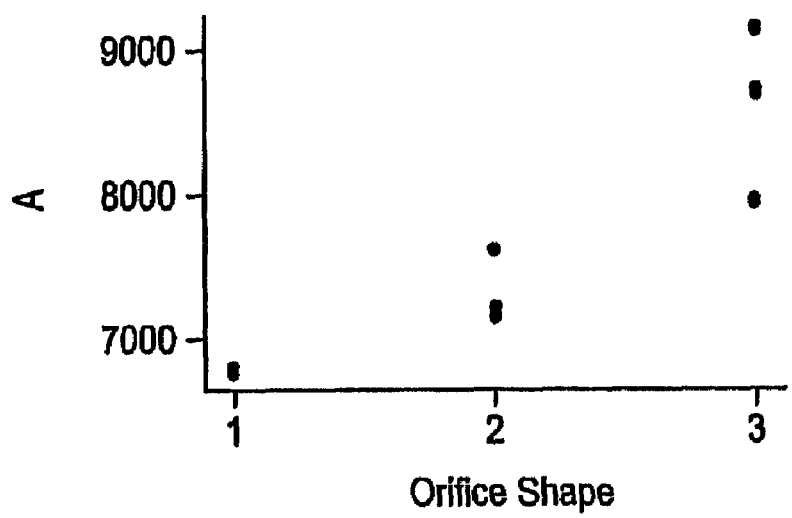
FIG. 6A and FIG. 6B show deposition rate and uniformity relationships for the FIG. 3A, FIG. 3B and FIG. 3C cascade plate configurations.
Figure 6B:
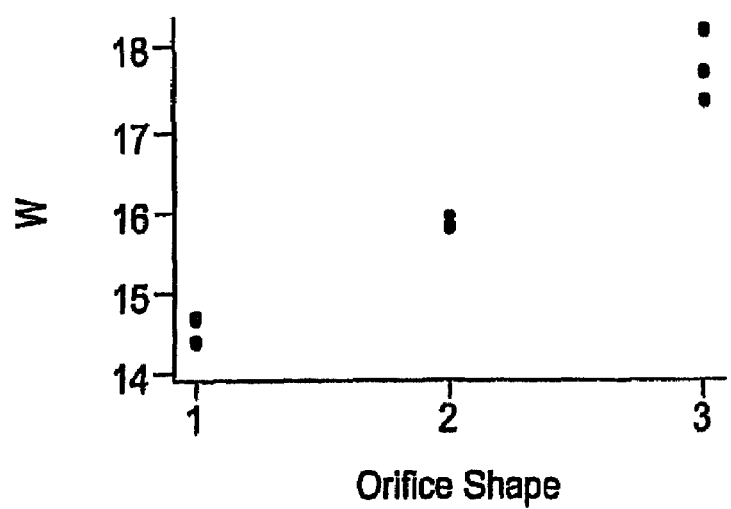

The characteristics (e.g., coating thickness, degree of etching or activation) of a region treated by a single plasma generator, such as an ETP generator, generally exhibit a profile having a Gaussian distribution about the axis of the plasma generator. When multiple plasma generators are used to treat article 150, uniformity may be promoted by positioning the individual plasma generators such that the resulting Gaussian distributions overlap. The profile, as well as the width and height of the distributions, are dependent in part upon the characteristics of the plasmas that are used to treat the substrate. The characteristics of each of the plasmas are in turn dependent upon the conditions—such as cathode voltage, plasma gas pressure and cathode-to-anode distance (gap 110)—used to generate the plasmas within the individual plasma generators. From additional experiments in which interlayers were deposited from VTMS (described in the EXAMPLES), it was found that both deposition rate and deposition uniformity increase as length of the cylindrical straight wall increases as illustrated in FIG. 6A and FIG. 6B. In FIG. 6A, A equals area (in nm×cm) under a Gaussian Profile deposited in Static Mode. In FIG. 6B, w equals width of the Gaussian profile in cm.

The following Examples are illustrative and should not be construed as a limitation on the scope of the claims unless a limitation is specifically recited.

EXAMPLES 1 TO 11

In the following EXAMPLES, a FIG. 2 device using a cascade plate orifice design listed in TABLE 1 was operated at 70 amps flowing 2 lpm of Ar through the plasma chamber. Gap (110) was ~2 mm. Current was measured and supplied by a Miller 200 arc welding power supply. Voltage drop across the cascade plate was measured with a digital multimeter with greater than 10-12 Mohm input impedance. Resistance was calculated from the current and voltage V=IR and resistivity was calculated from the resistance and geometric factor R (ohms)=resistivity (ohm-cm)* l/A (cm-1).

TABLE 1

Cascade Plate Representative Designs

| ex # | Design | #plates | Resistivty Ohm-cm | l/A cm-1 | resistance ohms | current amps | Ar flow slpm | Voltage volts | power watts | Pressure torr |
|---|---|---|---|---|---|---|---|---|---|---|
| 1 | FIG. 3a | 1 | 0.011 | 7.8 | 0.085 | 70 | 2 | 6 | 420 | 700 |
| 2 | FIG. 3b | 1 | 0.012 | 13.3 | 0.157 | 70 | 2 | 11 | 770 | 1000 |
| 3 | FIG. 3c | 1 | 0.011 | 49.2 | 0.525 | 70 | 2 | 37 | 2590 | >1200 |
| 4 | 1.8 mm straight | 1 | 0.013 | 19.2 | 0.267 | 70 | 2 | 19 | 1330 | 700 |
| 5 | 2.0 mm straight | 1 | 0.012 | 15.6 | 0.188 | 70 | 2 | 13 | 910 | 553 |
| 6 | Inverted example 1 | 1 | 0.041 | 7.8 | 0.32 | 70 | 2 | 22.4 | 1568 | 700 |
| 7 | Asymetric orifice | 1 | 0.036 | 20.0 | 0.733 | 30 | 2 | 22 | 660 | 1000 |
| 8 | Expanding channel a | 2 | 0.03 | 7.8 | 0.23 | 70 | 2 | 17 | 1190 | >1200 |
| 9 | 2.0 mm straight | 2 | 0.021 | 15.6 | 0.327 | 70 | 2 | 22 | 1540 | 770 |
| 10 | 2.5 mm straight | 2 | 0.029 | 10 | 0.296 | 70 | 2 | 20.7 | 1450 | 437 |
| 11 | Comparative Ex. 2 to 8 | | 0.032 | 3.9 | 0.126 | 70 | 2 | 8.7 | 609 | |

In all the EXAMPLES, thickness of the cascade plate was constant at 4.9 mm. TABLE 1 lists the number of plates used, resistivity of the plasma achieved with the identified configuration and the geometric factor of the design (l/A) where l=length of the orifice channel and A=area of the channel. For a diverging channel orifice, l/A is a net value for the entire channel. Also, TABLE 1 shows resistance, voltage, pressure and watts obtained at listed currents and Ar flows. The term "expanding channel" refers to the FIG. 3A and FIG. 3B designs. All designs designated as "straight" refer to FIG. 3C designs with an orifice diameter as listed in TABLE 1.

In EXAMPLE 1 of TABLE 1, the design had a cascade plate with the expanding channel design shown in FIG. 3A. This plate had a 1.32 mm diameter orifice that was straight for 0.81 mm, then expanded at a 25-degree angle. "Expanding channel a," "expanding channel b" and "straight" configurations respectively correspond to the configurations of FIG. 3A, FIG. 3B and FIG. 3C. In all EXAMPLES, the expanding orifice was on the anode side of the arc unless otherwise stated.

For EXAMPLE 2, the FIG. 3A cascade plate of EXAMPLE 1 was removed by loosening adjustment bolts 128 and removing rods 124. A cascade plate with the expanding channel FIG. 3B design was placed within the cathode housing and rods 124 and adjustment bolts 128 were replaced. The cascade plate of this EXAMPLE had a 1.32 mm diameter orifice that was 1.62 mm long then expanded at a 25-degree angle as shown in FIG. 3B.

In EXAMPLE 3, the cascade plate of EXAMPLE 2 was replaced with a 4.9 mm long, 1.32 mm diameter orifice cascade plate as shown in FIG. 3C. This design included no expanding section. The design was straight walled for the entire 4.9 mm length.

EXAMPLES 1 to 3 of TABLE 1 show that a higher arc pressure can be obtained by increasing length of the orifice straight channel without increasing diameter. FIG. 4A, FIG. 4B and FIG. 4C and FIG. 5A, FIG. 5B and FIG. 5C show pressure and voltage for additional Ar flows and currents for the cascade plates of EXAMPLES 1 to 3. These EXAMPLES show that higher pressure in the arc can be achieved for the same current and Ar flow.

TABLE 1 data indicate that increasing the orifice channel length results in higher resistance and power. Higher power and hence thermal load on the substrate is advantageous for higher temperature deposition applications.

EXAMPLES 3 to 5 show that increasing the orifice diameter results in lower pressure and lower thermal load.

EXAMPLES 1, 4, 6 show that orifice configuration can be selected to provide equal pressure with differing thermal loads.

Additionally, devices with cascade plates of EXAMPLES 1 to 3 were used to deposit an interlayer coating on PC using vinyltrimethylsilane (VTMS) reactant. In these EXAMPLES, 0.3 slpm of VTMS, was injected through a ring into the expanding plasma. The ring was ~5 cm from the anode. Conditions were constant at 1.65 lpm Ar, and 40 amps. Only cascade plate design was changed. Deposition was conducted for 10 seconds onto a stationary 4"×4" substrate. The substrate was positioned so that its center line was conformal with the centerline of the arc. Coating thickness was measured across the substrate in 1 cm steps to provide a coating thickness profile.

The resulting Gaussian profiles were compared for area (A) under the profile, which represents total coating deposited and for width (w), which is a measure of coating beam expansion. FIG. 6A and FIG. 6B abscissa values are the 3A. 3B and 3C orifice configurations (shapes 1, 2 and 3 of FIG. 6A and FIG. 6B, respectively). Hence, FIG. 6A and FIG. 6B show increased pressure (FIG. 6A) and faster deposition rate (FIG. 6B) as orifice straight portion is elongated. Increased pressure and deposition rate are important factors in achieving large area deposition at low cost.

EXAMPLES 1 to 5 show that many single cascade plate designs can be achieved all showing a low resistivity of the plasma. In contrast, state of the art designs typically have 2 to 8 plates. Comparative EXAMPLE 11 is a typical 2 to 8-plate 4 mm straight channel design. As shown, this design results in a much higher resistivity of the plasma, typically 0.032 ohm-cm, and a high wattage across each plate. Note that the watts are for just one of the 2 to 8 plates hence an 8-plate design would require a power across the plates of 4936 watts. This results in much higher operating cost and larger more expensive power supplies.

EXAMPLE 6 was a cascade plate design of EXAMPLE 1 but with reversed orifice having a cathode adjacent cone section and an anode adjacent straight section. Surprisingly the resistivity of the plasma of this plate was equivalent to a double plate design. EXAMPLE 6 illustrates another manner in which a single cascade plate design can control and change the properties of the plasma.

EXAMPLE 7 was a cascade plate with an asymmetric orifice which was a slit ~5 mm long by 0.5 mm wide. This design provides for much higher resistivity, power, and pressure for a single plate design. This arc was only run at 30 A due to the high pressure.

Comparing EXAMPLES 4 and 7 shows the effect of the same l/A but with difference aspect ratios and hence difference wall surface areas. EXAMPLE 7 with higher wall interaction results in much higher resistivity and pressure.

EXAMPLES 7 to 9 show that a double cascade design with EXAMPLES 1, 5 and a 2.5 mm straight orifice configuration also result in higher resistivity. Thus increasing from one to two cascade plates causes a 2 to 3 fold increase in the resistivity of the plasma. These EXAMPLES show that lower resistivity is a major benefit of a single cascade plate design.

The EXAMPLES show that cascade plate design can be utilized to tailor plasma properties to achieve a range of performance features.

EXAMPLES 12 TO 15

Cascade plate design was tested to ascertain effect on Abrasion Layer Performance. In these EXAMPLES, coatings were deposited onto MR10 (commercially available silicon hardcoated polycarbonate sheets from GE Structured Products). The sheets were coated with 2 layers of abrasion resistant coatings. Each layer was deposited for 8 seconds using 0.19 slpm of D4, 1.65 lpm Ar and 70 amps. A first coating was applied at an oxygen flow rate of 0.3 slpm and the second layer, at an oxygen flow rate of 0.8 slpm.

The resulting samples were tested for abrasion using the ASTM D1044 Taber test. The samples were immersed in 65° C. water for 3 days and the adhesion tested with a crosshatch taper test. Adhesion was rated as 1 to 5 B following the ASTM D3359-92 A standard with 5 B being no separation. The maximum temperature during deposition was measured with an IR sensor. TABLE 2 lists deposition temperature, deposit thickness in microns, change in haze after 1000 cycles with CS10F wheels, and adhesion after water immersion.

As shown in TABLE 2, the FIG. 3A, FIG. 3B and FIG. 3C designs gave coatings with similar Taber abrasion. However, higher wattage increased thermal load on substrates resulting in higher deposition temperatures and poorer water soak stability. This may be due to increased stress from the higher temperatures. In the higher wattage case, an optimum orifice design can be selected to provide an equal pressure at lower power. This selection provides lower operating costs and improved coating performance.

TABLE 2

| CP design | Dep Temp (C.) | Thick (μm) | Taber dHaze | WI adhesion (1 to 5B) |
|---|---|---|---|---|
| Expanding channel a | 72 | 2.08 | 4.0 | 5 |
| 1.8 mm straight | 96 | 2.73 | 3.8 | 3 |
| Exp channel a inverted | 82 | 2.50 | 3.9 | 4 |

EXAMPLE 16

In order to show that the design of the orifice in a single cascade plate ETP generator has a statistically significant effect on the degree of precursor dissociation in the downstream reactor, a Designed Experiment (DoE) was performed using two cascade plates with different orifices and using varying argon flow, precursor (VTMS) flow, and plasma current as control parameters. The voltage required to sustain the plasma at the various conditions was measured and used to calculate power going into the plasma. Degree of dissociation was evaluated by measuring partial pressure of the precursor before the plasma was turned on (i.e. partial pressure of the undisassociated precursor) and after the plasma was turned on (i.e. partial pressure of the dissociated precursor). The ratio of the partial pressures was proportionate to the degree of precursor dissociation. Plates configured with an initial cylindrical portion and a final conical portion as shown in FIG. 3A, were used to provide control parameters. Cylindrical portion length was varied from a standard length of 0.08 mm for the control design to twice the standard length. These designs are the same as used in EXAMPLES 1 and 2 respectively. The Designed experiment and its statistical analysis follow:

TABLE 3

SETUP OF DOE

| | Control Parameters | | | | Responses | |
|---|---|---|---|---|---|---|
| Gas | Cascade | Ar Flow | VTMS flow | Current | Resulting Power | Resulting Pressure Ratio |
| VTMS | Double Length | 2 | 0.15 | 40 | 1440 | 3.1 |
| VTMS | Double Length | 2 | 0.15 | 60 | 2430 | 3.66667 |
| VTMS | Double Length | 2 | 0.35 | 40 | 1376 | 2.14286 |
| VTMS | Double Length | 2 | 0.35 | 60 | 2400 | 3.11429 |
| VTMS | Double Length | 1 | 0.15 | 40 | 1224 | 2.16667 |
| VTMS | Double Length | 1 | 0.15 | 60 | 2088 | 2.96667 |
| VTMS | Double Length | 1 | 0.35 | 40 | 1228 | 1.71429 |
| VTMS | Double Length | 1 | 0.35 | 60 | 2082 | 2.37143 |
| VTMS | Standard | 2 | 0.15 | 40 | 960 | 2.46667 |
| VTMS | Standard | 2 | 0.15 | 60 | 1626 | 3.33333 |
| VTMS | Standard | 2 | 0.35 | 40 | 928 | 1.77143 |
| VTMS | Standard | 2 | 0.35 | 60 | 1602 | 2.57143 |
| VTMS | Standard | 1 | 0.15 | 40 | 832 | 1.8 |
| VTMS | Standard | 1 | 0.15 | 60 | 1416 | 2.33333 |
| VTMS | Standard | 1 | 0.35 | 40 | 836 | 1.42857 |
| VTMS | Standard | 1 | 0.35 | 60 | 1404 | 1.85714 |

TABLE 4

Estimated Effects and Coefficients for Power (coded units)

| Term | Effect | Coef | StDev Coef | T | P |
|---|---|---|---|---|---|
| Constant | | 1 | 26.44 | 56.42 | 0.000 |
| Cascade | −583.0 | 1 | 26.44 | −11.03 | 0.000 |
| Ar Flow | 206.5 | 1 | 26.44 | 3.90 | 0.002 |
| VTMS flo | −20.0 | 1 | 26.44 | −0.38 | 0.713 |
| Current | 778.0 | 1 | 26.44 | 14.71 | 0.000 |

TABLE 5

Analysis of Variance for Power (coded units)

| Source | DF | Seq SS | Adj SS | Adj MS | F | P |
|---|---|---|---|---|---|---|
| Main Effects | 4 | 3952861 | 3952861 | 988215 | 88.32 | 0.000 |
| Residual Error | 11 | 123075 | 123075 | 11189 | | |
| Total | 15 | 4075936 | | | | |

Analysis for "Ratio of Dissociated VTMS Partial Pressure to Undisassociated VTMS Partial Pressure" response:

TABLE 5

Estimated Effects and Coefficients for Pressure (coded units)

| Term | Effect | Coef | StDev Coef | T | P |
|---|---|---|---|---|---|
| Constant | | 2.4253 | 0.03360 | 72.18 | 0.000 |
| Cascade | −0.4601 | −0.2301 | 0.03360 | −6.85 | 0.000 |
| Ar Flow | 0.6911 | 0.3455 | 0.03360 | 10.28 | 0.000 |
| VTMS flo | −0.6077 | −0.3039 | 0.03360 | −9.04 | 0.000 |
| Current | 0.7030 | 0.3515 | 0.03360 | 10.46 | 0.000 |

TABLE 6

Analysis of Variance for Pressure (coded units)

| Source | DF | Seq SS | Adj SS | Adj MS | F | P |
|---|---|---|---|---|---|---|
| Main Effects | 4 | 6.2113 | 6.2113 | 1.55281 | 85.95 | 0.000 |
| Residual Error | 11 | 0.1987 | 0.1987 | 0.01807 | | |
| Total | 15 | 6.4100 | | | | |

Figure 7A:
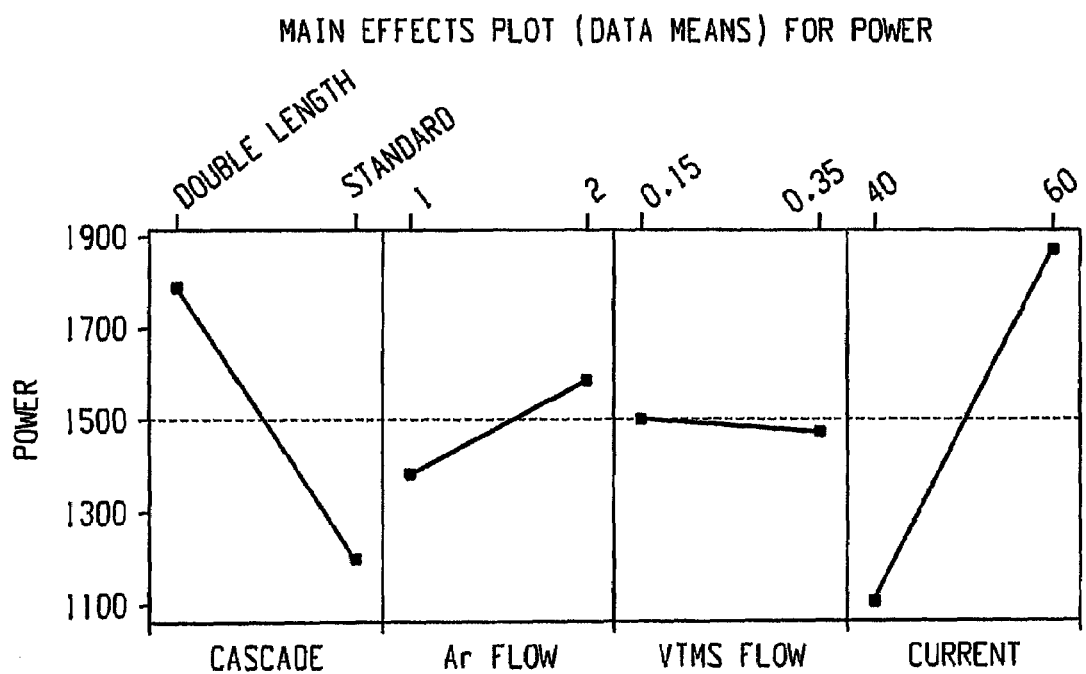
FIG. 7A shows a main effects plot of responses for power
Figure 7B:
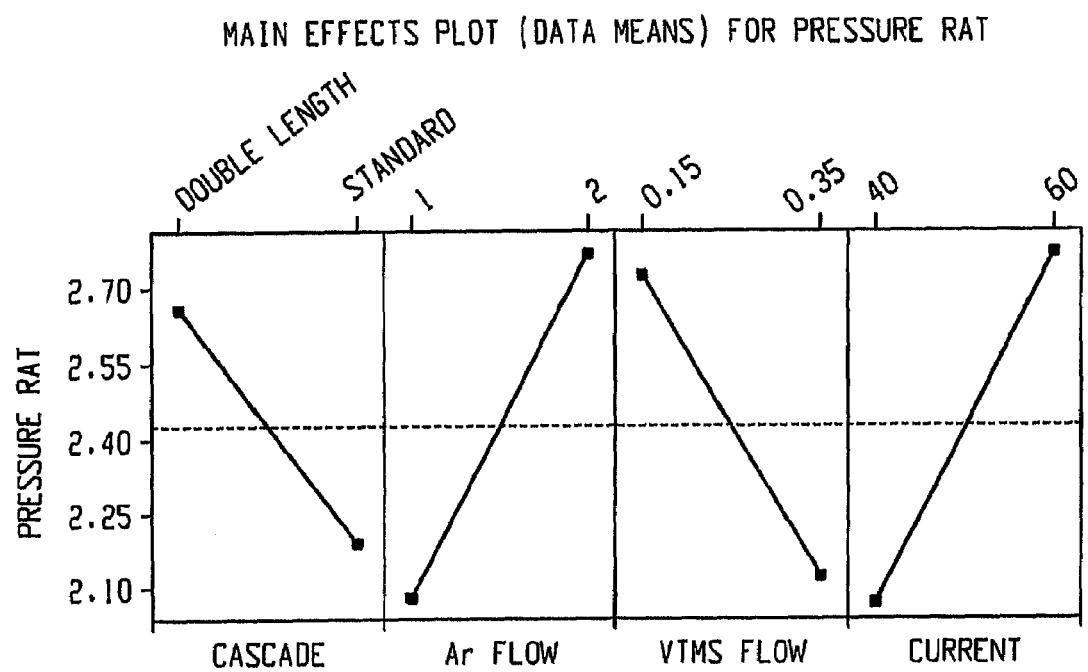
FIG. 7B shows a main effects plot (data means) of responses for pressure ratio.

FIG. 7A and FIG. 7B are Main Effect Plots of the Responses versus the various factors.

The foregoing statistical analysis shows that both for the Power going into the ETP source and the degree of dissociation the p-value of the cascade Plate control parameter is less than 0.05. Thus the cascade plate orifice design is shown to have a statistically significant effect on the two responses. In summary, by changing the cascade plate orifice design one can thus control the degree of dissociation of a precursor injected into the expanding thermal plasma.

While preferred embodiments of the invention have been described, the present invention is capable of variation and modification and therefore should not be limited to the precise details of the EXAMPLES. The invention includes changes and alterations that fall within the purview of the following claims.

What is claimed is:

1. A method of depositing a layer on a substrate, comprising:
    determining a target process condition selected from a target ionization voltage, a target pressure, and a target resistivity, within a chamber of an expanding thermal plasma generator for plasma enhanced chemical vapor deposition of a coating on a substrate; the generator comprising a cathode, replaceable cascade plate and anode with concentric orifice; and
    replacing the cascade plate with another plate having a configured orifice to effect the identified target process condition; and
    generating a plasma at the target process condition by providing a plasma gas to the plasma generator and ionizing the plasma gas in an arc between cathode and anode within the generator and expanding the gas as a plasma onto a substrate in a deposition chamber.

2. The method of claim 1, comprising determining a target ionization voltage applied to the plasma gas within the generator and replacing the cascade plate with another plate having an orifice configured to effect the target ionization voltage.

3. The method of claim 1, comprising determining a target ionization voltage applied to the plasma gas within the generator and replacing the cascade plate with another plate having an orifice configured with a straight wall length to effect the target ionization voltage.

4. The method of claim 1, comprising determining a target pressure of the plasma gas within the generator and replacing the cascade plate with another plate having an orifice configured to effect the target pressure.

5. The method of claim 1, comprising determining a target pressure of the plasma gas within the generator and replacing the cascade plate with another plate having an orifice configured with a straight wall length to effect the target pressure.

6. The method of claim 1, further comprising injecting a reactant gas into the plasma within the generator.

7. The method of claim 1, further comprising injecting a reactant gas into the plasma within the generator, determining a target resistivity for the plasma and replacing the cascade plate with another have having an orifice configured to effect the target resistivity.

8. The method of claim 1, further comprising injecting a reactant gas into the plasma within the generator, determining a target resistivity for the plasma and replacing the cascade plate with another having an orifice configured with a straight wall length to effect the target plasma resistivity.

9. The method of claim 1, wherein the another cascade plate orifice has a length of 1 mm to less than 20 mm.

10. The deposition apparatus of claim 1, wherein the another cascade plate orifice has a length of 1.5 mm to 10 mm.

11. The deposition apparatus of claim 1, wherein the another cascade plate orifice has a length of 2 mm to 8 mm.

12. The method of claim 1, wherein the substrate is a thermoplastic substrate.

13. The method of claim 12, wherein the thermoplastic is a polycarbonate.

14. The method of claim 1, wherein the plasma is an argon or argon-oxygen-organosiloxane plasma.

15. The method of claim 1, wherein the plasma is generated to deposit successive coatings on the substrate.

16. The method of claim 1, wherein the substrate is planar.

17. The method claim 1, wherein the substrate is curved.

* * * * *